United States Patent
Fang et al.

(10) Patent No.: US 7,382,658 B2
(45) Date of Patent: Jun. 3, 2008

(54) NON-VOLATILE MEMORY EMBEDDED IN A CONVENTIONAL LOGIC PROCESS AND METHODS FOR OPERATING SAME

(75) Inventors: Gang-feng Fang, Alameda, CA (US); Wingyu Leung, Cupertino, CA (US)

(73) Assignee: MoSys, Inc., Sunnyvale, CA (US)

( * ) Notice: Subject to any disclaimer, the term of this patent is extended or adjusted under 35 U.S.C. 154(b) by 0 days.

(21) Appl. No.: 11/421,986

(22) Filed: Jun. 2, 2006

(65) Prior Publication Data
US 2007/0279987 A1    Dec. 6, 2007

Related U.S. Application Data

(63) Continuation-in-part of application No. 11/341,881, filed on Jan. 26, 2006.

(51) Int. Cl.
G11C 11/34    (2006.01)
G11C 11/24    (2006.01)

(52) U.S. Cl. .............. 365/185.26; 365/149; 365/185.05

(58) Field of Classification Search ........... 365/185.05, 365/185.26, 149
See application file for complete search history.

(56) References Cited

U.S. PATENT DOCUMENTS

| | | |
|---|---|---|
| 4,811,076 A | 3/1989 | Tigelaar et al. |
| 5,108,941 A | 4/1992 | Patterson et al. |
| 5,198,995 A | 3/1993 | Dennard et al. |
| 5,301,150 A | 4/1994 | Sullivant et al. |
| 5,365,486 A | 11/1994 | Schreck |
| 5,394,365 A | 2/1995 | Tsukikawa |
| 5,414,671 A | 5/1995 | Fukumoto |
| 5,504,706 A | 4/1996 | D'Arrigo et al. |
| 5,511,020 A | 4/1996 | Hu et al. |
| 5,600,598 A | 2/1997 | Skjaveland et al. |
| 5,621,683 A * | 4/1997 | Young .................. 365/185.05 |
| 5,654,237 A | 8/1997 | Suguro et al. |

(Continued)

OTHER PUBLICATIONS

Shukuri et al. "CMOS Process Compatible ie-Flash(inverse gate electrode Flash) Technology for System-on-a-Chip", IEEE 2001 Custom Integrated Circuits Conference, pp. 179-182.

(Continued)

*Primary Examiner*—Ly D Pham
(74) *Attorney, Agent, or Firm*—Bever, Hoffman & Harms, LLP; E. Eric Hoffman

(57) ABSTRACT

A non-volatile memory system including an array of cells, each having an access transistor and a capacitor sharing a floating gate. The access transistors in each row are fabricated in separate well regions, which are independently biased. Within each row, the source of each access transistor is coupled to a corresponding virtual ground line, and each capacitor structure is coupled to a corresponding word line. Alternately, the source of each access transistor in a column is coupled to a corresponding virtual ground line. Within each column, the drain of each access transistor is coupled to a corresponding bit line. Select memory cells in each row are programmed by band-to-band tunneling. Bit line biasing prevents programming of non-selected cells of the row. Programming is prevented in non-selected rows by controlling the well region voltages of these rows. Sector erase operations are implemented by Fowler-Nordheim tunneling.

11 Claims, 12 Drawing Sheets

U.S. PATENT DOCUMENTS

| | | | |
|---|---|---|---|
| 5,694,355 A | 12/1997 | Skjaveland et al. | |
| 5,696,036 A | 12/1997 | Su et al. | |
| 5,699,297 A | 12/1997 | Yamazaki et al. | |
| 5,700,708 A | 12/1997 | Chen et al. | |
| 5,723,355 A | 3/1998 | Chang et al. | |
| 5,736,764 A | 4/1998 | Chang | |
| 5,761,126 A | 6/1998 | Chi et al. | |
| 5,783,470 A | 7/1998 | Rostoker | |
| 5,879,990 A | 3/1999 | Dormans et al. | |
| 5,940,324 A | 8/1999 | Chi et al. | |
| 5,953,255 A | 9/1999 | Lee | |
| 6,060,403 A | 5/2000 | Yasuda et al. | |
| 6,064,595 A | 5/2000 | Logie et al. | |
| 6,102,963 A | 8/2000 | Agrawal | |
| 6,145,069 A | 11/2000 | Dye | |
| 6,180,453 B1 | 1/2001 | Sung et al. | |
| 6,218,234 B1 | 4/2001 | Yu et al. | |
| 6,221,007 B1 | 4/2001 | Green | |
| 6,232,631 B1 | 5/2001 | Schmidt et al. | |
| 6,256,248 B1 | 7/2001 | Leung | |
| 6,278,159 B1 | 8/2001 | Patelmo et al. | |
| 6,282,123 B1 | 8/2001 | Mehta | |
| 6,329,240 B1 | 12/2001 | Hsu et al. | |
| 6,415,353 B1 | 7/2002 | Leung | |
| 6,449,685 B1 | 9/2002 | Leung | |
| 6,504,780 B2 | 1/2003 | Leung | |
| 6,512,691 B2 | 1/2003 | Hsu et al. | |
| 6,548,355 B2 | 4/2003 | Pio | |
| 6,803,299 B2 | 10/2004 | Eitan | |
| 6,898,140 B2 | 5/2005 | Leung et al. | |
| 7,200,038 B2 * | 4/2007 | Lee et al. | 365/185.05 |
| 7,257,033 B2 * | 8/2007 | Wang et al. | 365/185.28 |
| 2003/0032241 A1 | 2/2003 | Seo et al. | |
| 2005/0281087 A1 * | 12/2005 | Shirota et al. | 365/185.26 |

OTHER PUBLICATIONS

Takeshima et al. "A 3.3 V Single-Power-Supply 64Mb Flash Memory with Dynamic Bit-Line Latch (DBL) Programming Scheme", 1994 IEEE International Solid-State Circuits Conference, Digest of Technical Papers, pp. 148-149.

Houdt et al. "Analysis of the Enhanced Hot-Electron Injection in Split-Gate Transistors Useful for EEPROM Applications", IEEE Transactions on Electron Devices, vol. 39, No. 5, May 1992, pp. 1150-1156.

* cited by examiner

| PROGRAM MODE (PROGRAM CELL 100) | |
|---|---|
| TERMINAL | APPLIED VOLTAGE |
| $WL_0$ | 5 VOLTS |
| $WL_1$ | 2.5 VOLTS |
| $BL_0$ | -2.5 VOLTS |
| $BL_1$ | 0 VOLTS |
| $VG_0$ | 0 VOLTS |
| $VG_1$ | 0 VOLTS |
| $NW_0$ | 2.5 VOLTS |
| $NW_1$ | 0 VOLTS |
| P-SUB | 0 VOLTS |

FIG. 4A

| ERASE MODE (ERASE ALL CELLS) | |
|---|---|
| TERMINAL | APPLIED VOLTAGE |
| $WL_0$ | 0 VOLTS |
| $WL_1$ | 0 VOLTS |
| $BL_0$ | 10 VOLTS |
| $BL_1$ | 10 VOLTS |
| $VG_0$ | 10 VOLTS |
| $VG_1$ | 10 VOLTS |
| $NW_0$ | 10 VOLTS |
| $NW_1$ | 10 VOLTS |
| P-SUB | 0 VOLTS |

FIG. 4B

| PROGRAM MODE (PROGRAM CELL 600) | |
|---|---|
| TERMINAL | APPLIED VOLTAGE |
| $WL_0$ | -3 VOLTS |
| $WL_1$ | 0 VOLTS |
| $BL_0$ | 5 VOLTS |
| $BL_1$ | 0 VOLTS |
| $VG_0$ | 0 VOLTS |
| $VG_1$ | 0 VOLTS |
| $PW_0$ | 0 VOLTS |
| $PW_1$ | 2.5 VOLTS |
| DNW | 2.5 VOLTS |
| P-SUB | 0 VOLTS |

FIG. 9A

| ERASE MODE (ERASE ALL CELLS) | |
|---|---|
| TERMINAL | APPLIED VOLTAGE |
| $WL_0$ | 5 VOLTS |
| $WL_1$ | 5 VOLTS |
| $BL_0$ | -5 VOLTS |
| $BL_1$ | -5 VOLTS |
| $VG_0$ | -5 VOLTS |
| $VG_1$ | -5 VOLTS |
| $PW_0$ | -5 VOLTS |
| $PW_1$ | -5 VOLTS |
| DNW | 5 VOLTS |
| P-SUB | 0 VOLTS |

FIG. 9B

NON-VOLATILE MEMORY EMBEDDED IN A CONVENTIONAL LOGIC PROCESS AND METHODS FOR OPERATING SAME

RELATED APPLICATIONS

This is a continuation in part of U.S. patent application Ser. No. 11/341,881- filed Jan. 26, 2006 "Method To Increase Charge Retention Of Non-Volatile Memory Manufactured In A Single-Gate Logic Process" by Gang-feng Fang, Wingyu Leung, and Dennis Sinitsky.

FIELD OF THE INVENTION

The present invention relates to non-volatile memory (NVM). More particularly, this invention relates to non-volatile memory cells fabricated using an application specific integrated circuit (ASIC) or conventional logic process. This invention further relates to a method of operating a non-volatile memory to ensure maximum data retention time. The invention also relates to a system-on-chip (SoC) architecture which includes both non-volatile memory and dynamic random access memory (DRAM) that operates like static random access memory (SRAM), wherein the SoC is fabricated using a conventional logic process.

RELATED ART

For system-on-chip (SoC) applications, it is desirable to integrate many functional blocks into a single integrated circuit. The most commonly used blocks include a microprocessor or micro-controller, memory blocks, blocks, and various functional logic blocks, all of which are fabricated on the same chip. The memory blocks can include any combination of volatile random access memory (SRAM), non-volatile memory and/or register-based memory. The register-based memory is typically used where a small amount of high speed storage is required (e.g., for register files and/or small tables to be used by one or more functional logic blocks within the SoC).

Larger volatile or non-volatile memory blocks are also typically required in SoC designs. It is advantageous to keep the layout area of these larger memory blocks as small as possible. It is therefore desirable to use small memory structures to implement the required large memory blocks. If the larger memory block is to be a volatile memory, the choices are typically six-transistor SRAM memory cells or dynamic memory cells, which must be refreshed. The refresh function imposes unnecessary constraints on the functional logic blocks in the SoC. One solution to overcome these constraints is to use a one-transistor SRAM (1T-SRAM) system, which implements dynamic memory cells with an SRAM-type interface so the refresh function is not required (or available) at the memory interface. A 1T-SRAM system can be fabricated using a conventional logic process. Fabrication and operation of a 1T-SRAM system and the associated hidden refresh mechanisms are disclosed in U.S. Pat. Nos. 6,256,248, 6,898,140, 6,415,353, 6,449,685 and 6,504,780 which are hereby incorporated by reference in their entirety.

If a large non-volatile memory block is also required, it would be advantageous to be able to use the same process for fabricating the functional logic blocks, 1T-SRAM system and the non-volatile memory block to realize a low cost SoC. It would further be desirable if all of these elements could be fabricated using a conventional logic process. However, traditional processes for fabricating non-volatile memory, which typically use stacked gate or split-gate memory cells, are not compatible with a conventional logic process.

One example of a split-gate EEPROM is described in "Analysis of the Enhanced Hot-Electron Injection in Split-Gate Transistors Useful for EEPROM Applications", by J. V. Houdt, P. Heremans, L. Deferm, G. Groeseneken and H. E. Maes, in IEEE Transaction on Electron Devices, Vol. 39, No. 5, May 1992, pp. 1150-1156. An example of a stack-gate Flash memory is described in "A 3.3V single-Power-Supply 64 Mb Flash Memory with Dynamic Bit-Line Latch (DBL) Programming Scheme," by T. Takeshima, H. Sugawara, H. Takada, Y. Hisamune, K. Kanamori, T. Okazawa, T. Murotani, I. Sasaki, ISSCC Digest, 1994, pp. 148-149.

As used herein, a conventional logic process is defined as a semiconductor process that uses a single layer of polysilicon (i.e., a single conductive gate layer), without the addition of material in the gate-oxide. Prior art embedded non-volatile semiconductor memory cells include those described in U.S. Pat. No. 6,803,299 B2, "Non-volatile Electrically Erasable and Programmable Semiconductor Memory Cell Utilizing Asymmetrical Charge Trapping", by B. Eitan; and U.S. Pat. No. 5,940,324, "Single-Poly EEPROM Cell That is Programmable And Erasable in a Low-Voltage Environment", by M. H. Chi et al. In U.S. Pat. No. 6,803,299 B2, a charge trapping layer using silicon nitride or poly-silicon is embedded in the gate oxide of the cell transistor. However, this charge trapping layer is not generally available in an ASIC or logic process, nor is it incorporated in transistors used for logic gates. Therefore, the process steps of embedded a trapping layer into the gate oxide of the transistor have to be added to the basic logic process in order to facilitate the formation of this NVM cell.

In U.S. Pat. No. 5,940,324, a single-poly EEPROM cell, which includes a MOS transistor and a MOS structure, is described. The formation of the memory cell requires a triple-well logic process with additional process steps to form a base region.

An example of a conventional Flash memory embedded in a logic process without additional masking steps is described in "CMOS Process Compatible ie—Flash Technology for System-on-a-chip", by S. Shukuri et al., Digest of IEEE Custom Integrated Circuit Conference, 2001, pp. 179-182. The basic memory cell in this scheme consists of two NMOS and one PMOS transistors, thereby making this a relatively large cell (when compared with a two transistor cell).

Due to process, temperature and supply voltage variations during program and erase, non-volatile memory cells can be subject to an over-program and over-erase condition. Over-erase or over-programming causes the threshold voltage of the cell transistor to have a value outside the targeted operating range and may result in functional failure of the memory device. More importantly, due to process variation and defects, some of the memory cells in a memory array can be programmed or erased much faster or slower than the other memory cells. The over-erase or over-program problem in electrically erasable and programmable memory (EEPROM), where memory cells are erased and programmed individually, can easily be avoided by monitoring the cell current during program or erase operations. The monitoring provides feedback to the circuitry controlling the erase or program operation. During a program or erase operation, the selected cell current is monitored. When the current reaches the targeted level, the program or erase operation is stopped, thus avoiding the over-erase or over-program problem. However, in Flash memory, where a block of memory cells are erased simultaneously, monitoring individual cell currents during erase may be too time consuming to be practical.

Over-erased cells in a flash memory array may cause read failures in the array. For example, erase operations may be carried out using a band-to-band tunneling mechanism to inject electrons into the floating gate of a non-volatile memory cell, and program operations may be carried out using a Fowler-Nordheim tunneling mechanism to remove electrons from the floating gate of the non-volatile memory cell. If too many electrons are injected into the floating gate of a PMOS access transistor of a non-volatile memory cell during an erase operation (as a result of the difficult to control band-to-band tunneling mechanism), the threshold voltage of the PMOS access transistor will increase to an undesirable level (i.e., the PMOS access transistor will become undesirably conductive). If the number of electrons injected into the floating gate (by band-to-band tunneling) during an erase operation is significantly larger than the number of electrons that can be removed from the floating gate (by Fowler-Nordheim tunneling) during a subsequent program operation, an over-erase condition will exist, wherein excess electrons remain in the floating gate after a program operation is complete. The over-erase condition may eventually get to the point where programming is no longer possible (within practical limits). Under these over-erase conditions, the PMOS access transistor of the non-volatile memory cell will exhibit a conductive (erased) state, even if the cell should have a non-conductive (programmed) state. Thus, read operations to an over-erased non-volatile memory cell (as well as read operations to adjacent non-volatile cells in the same array) will produce erratic and invalid results. The over-erase condition will eventually lead to device failure.

It would therefore be desirable to implement a single-polysilicon non-volatile memory cell using a conventional logic process, where the possibility of over-erase conditions are minimized, and the detection of over-erase conditions is simplified. It would also be advantageous to be able to program and read the non-volatile memory cell while minimizing disturbances from write, erase and read operations, thereby improving the life and reliability of an array fabricated using the non-volatile memory cell. It is further desirable for such a memory cell to have a minimum layout area, and be able to retain sufficient charge for 20 years or longer.

SUMMARY

Accordingly, the present invention includes an array of non-volatile memory cells fabricated in a conventional logic process. As used herein, a conventional logic process is defined as a process that includes only one gate (polysilicon) layer. Each non-volatile memory cell in the array includes an access transistor and a capacitor structure that share a gate oxide layer commonly available in the conventional logic process. In order for the non-volatile memory cell to be able to retain sufficient charge for 20 years or longer, the gate oxide must have a thickness of 70 Angstroms or thicker. In deep sub-micron processes such as a conventional 0.13 um logic process, the logic transistors have an oxide thickness of about 20 Angstroms, which is much less than the required 70 Angstroms. However, in order for any silicon device to communicate with a standard 3.3V interface, a set of 3.3 Volt input/output (I/O) transistors are typically made available in most of the conventional deep sub-micron logic processes. In order to tolerate the 3.3 Volt supply, these I/O transistors are usually built with a gate-oxide thickness of 70 Angstroms. Therefore, it is possible to build the non-volatile memory cells of the present invention with a gate oxide of 70 Angstroms, without modifying these logic processes.

The non-volatile memory cells can be programmed and erased using relatively low voltages, which are generated from the available power supply voltages. As a result, the voltages required to program and erase the non-volatile memory cells can be provided by transistors readily available in a conventional logic process having 3.3 Volt I/O transistors.

The non-volatile memory cell array can be laid out in different configurations and be biased in different manners in the various embodiments. In one embodiment, each non-volatile memory cell of the array includes a PMOS access transistor and an NMOS capacitor structure, which share a common floating gate. The PMOS access transistors associated with each row of the array are fabricated in a corresponding isolated n-well region. Each isolated n-well region is biased by a separate control voltage. The drains of the PMOS access transistors associated with each column of the array are connected by a corresponding bit line. The floating gates of the non-volatile memory cells in each row of the array are coupled to a corresponding word line. This configuration allows the memory cells to be programmed in a random per bit manner using a band-to-band tunneling mechanism to inject electrons into the desired floating gates. During programming, the current through each of the programmed memory cells is monitored individually so as to avoid the over-program problem. This configuration also allows the memory cells to be erased using a Fowler-Nordheim tunneling mechanism to simultaneously remove electrons from the floating gates of all memory cells in a sector. Using Fowler-Nordheim tunneling to remove electrons from the floating gates has the advantage that the process is self-limiting. This self-limitation minimizes the probability of over-erasing the memory cells.

The non-volatile memory of the present invention can be included in a system-on-a-chip (SoC) architecture, along with dynamic memory configured to implement one-transistor static random access memory (1T-SRAM) with hidden refresh and other logic functions. The SoC can be fabricated using a conventional logic process to realize a highly optimized SoC produced at a low cost.

The present invention will be more fully understood in view of the following description and drawings.

BRIEF DESCRIPTION OF THE DRAWINGS

FIGS. 4A, 4B and 4C are tables that define program, erase and read operations, respectively, of the array of FIG. 3 in accordance with one embodiment of the present invention.

FIGS. 9A, 9B and 9C are tables that define program, erase and read operations of the array of FIG. 8 in accordance with one embodiment of the present invention.

DETAILED DESCRIPTION

Figure 1:
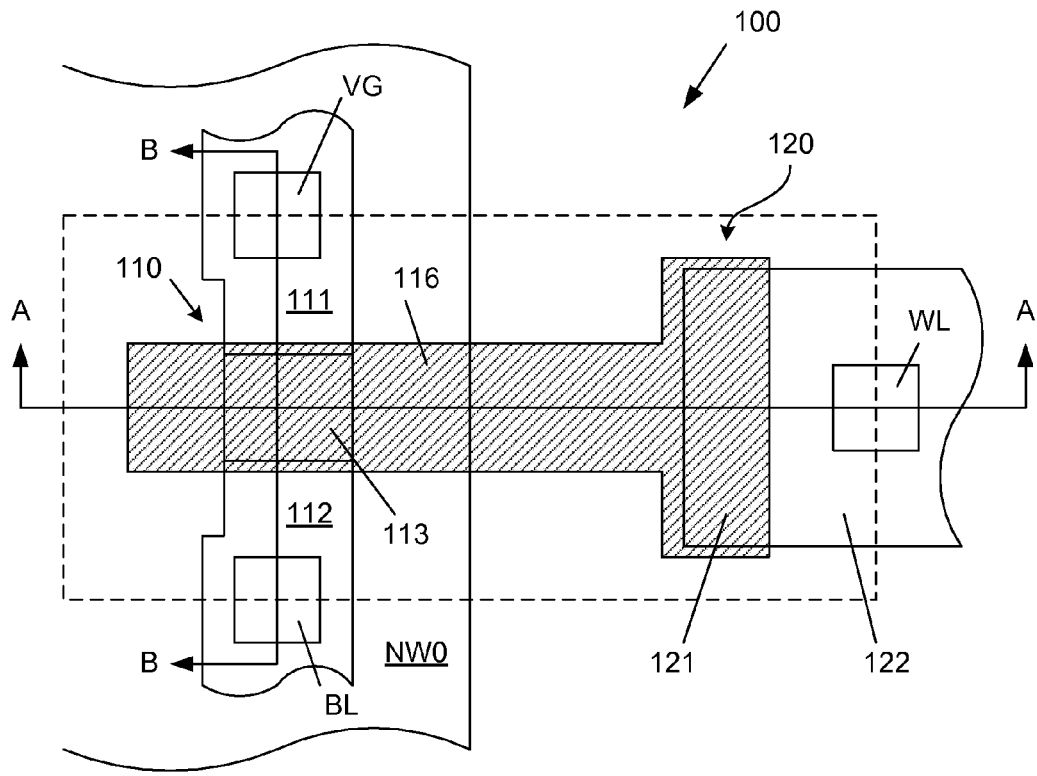
FIG. 1 is a top view of a non-volatile memory cell having a PMOS access transistor and an NMOS coupling gate.
Figure 2A:
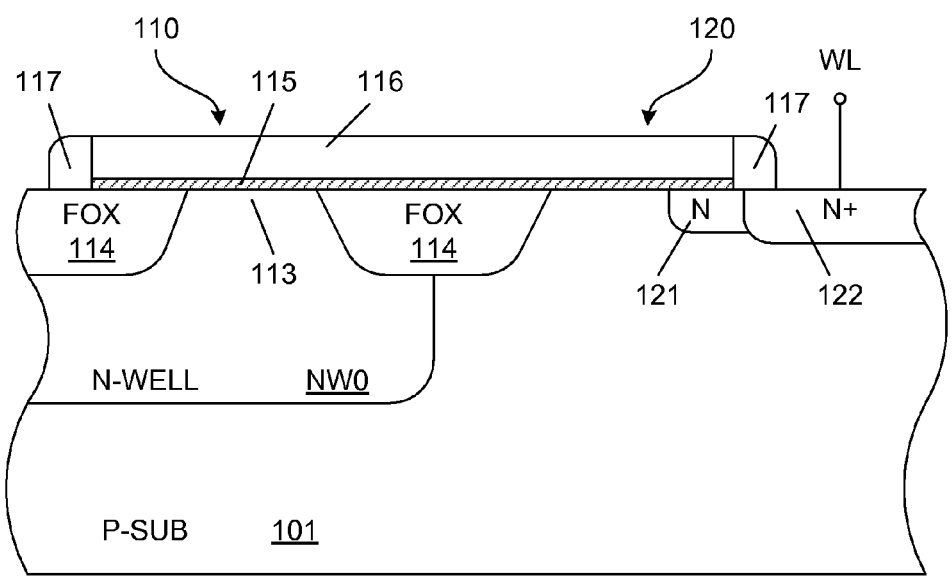
FIG. 2A is a cross-sectional view of the non-volatile memory cell of FIG. 1 along section line A-A.
Figure 2B:
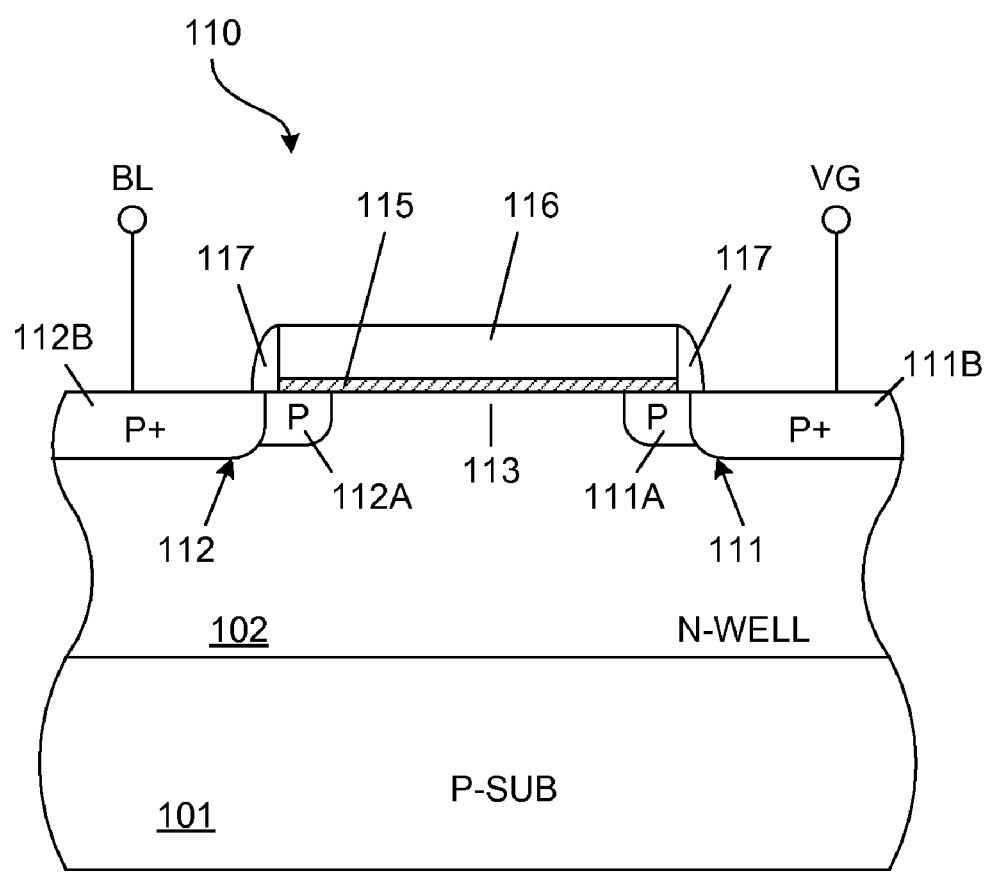
FIG. 2B is a cross-sectional view of the non-volatile memory cell of FIG. 1 along section line B-B.

FIG. 1 is a top layout view of a non-volatile memory cell 100 that can be fabricated using a conventional logic process. FIG. 2A is a cross-sectional view of non-volatile memory cell 100 along section line A-A. FIG. 2B is a cross-sectional view of non-volatile memory cell 100 along section line B-B. The structure and fabrication of non-volatile memory cell 100 is largely described in commonly-owned U.S. Pat. No. 6,512,691 to Hsu et al., which is hereby incorporated by reference in its entirety.

Non-volatile memory cell 100 is fabricated in a p-type monocrystalline semiconductor substrate 101 (e.g., silicon). Non-volatile memory cell 100 includes a PMOS access transistor 110, having a p-type source 111 and a p-type drain 112 fabricated in an n-well region $NW_0$. Source region 111 includes lightly doped source 111A and p+ source contact region 111B. Drain region 112 includes lightly doped drain 112A and p+ drain contact region 112B. A channel region 113 is located between source and drain regions 111-112. Source region 111 is connected to a virtual-ground (VG) line and drain region 112 is connected to a bit line (BL). Planarized field oxide 114 is located around the source, drain and channel regions of PMOS access transistor 110. A gate oxide layer 115 is located over the channel region 113. This gate oxide layer 115 has the same thickness as the gate oxide layers used in conventional input/output (I/O) transistors (not shown) fabricated in substrate 101. To maintain a data retention time of 20 years, the gate oxide thickness of gate oxide layer 115 is generally required to be 70 Angstroms or thicker. For conventional logic processes with feature sizes of less than 0.35 um, the logic transistors have an oxide thickness less than 70 Angstroms. However, most conventional deep sub-micron logic processes feature input/output (I/O) transistors with an oxide thickness greater than or equal to 70 Angstroms, such that these I/O transistors are not damaged by standard I/O voltages of 3.3 Volts or higher. The thicker oxide used to fabricate the I/O transistors is also used to form gate oxide layer 115, thereby enabling the non-volatile memory cell 100 to meet the 20 year data retention period. A conductively doped polycrystalline silicon floating gate 116 is located over gate oxide layer 115. Sidewall spacers 117, which are typically formed from silicon nitride or silicon oxide, are located at the lateral edges of floating gate 116.

Floating gate 116 and gate oxide layer 115 extend laterally beyond PMOS access transistor 110 over p-type substrate 101 and n-type coupling region 121. N-type coupling region 121 is coupled to n+ word line contact region 122. N+ word line contact region 122, in turn, is coupled to a word line (WL). The n-type coupling region 121 and n+ word line contact region 122 are formed by the n-type source/drain implants of a conventional logic process, thereby eliminating the need for any additional implants not normally provided by the conventional logic process. N-type regions 121-122, gate oxide layer 115 and floating gate 116 form an NMOS capacitor structure 120. NMOS capacitor structure 120 couples word line WL to floating gate 116. The total coupling capacitance of NMOS capacitor structure 120 is significantly larger than (e.g., 4×) the gate capacitance of PMOS access transistor 110. Non-volatile memory cell 100 can be fabricated using a conventional logic process, without any process modifications or special implants.

As described in U.S. Pat. No. 6,512,691, non-volatile memory cell 100 is erased on a per-sector basis by a band-to-band tunneling mechanism, wherein electrons are injected into the floating gate 116. U.S. Pat. No. 6,512,691 indicates that memory cell 100 is programmed using Fowler-Nordheim (FN) tunneling, wherein electrons are removed from floating gate 116. However, operating memory cell 100 in this manner may result in over-erase conditions. The present invention therefore provides an improved method of operating non-volatile memory cell 100 in an array.

Figure 3:
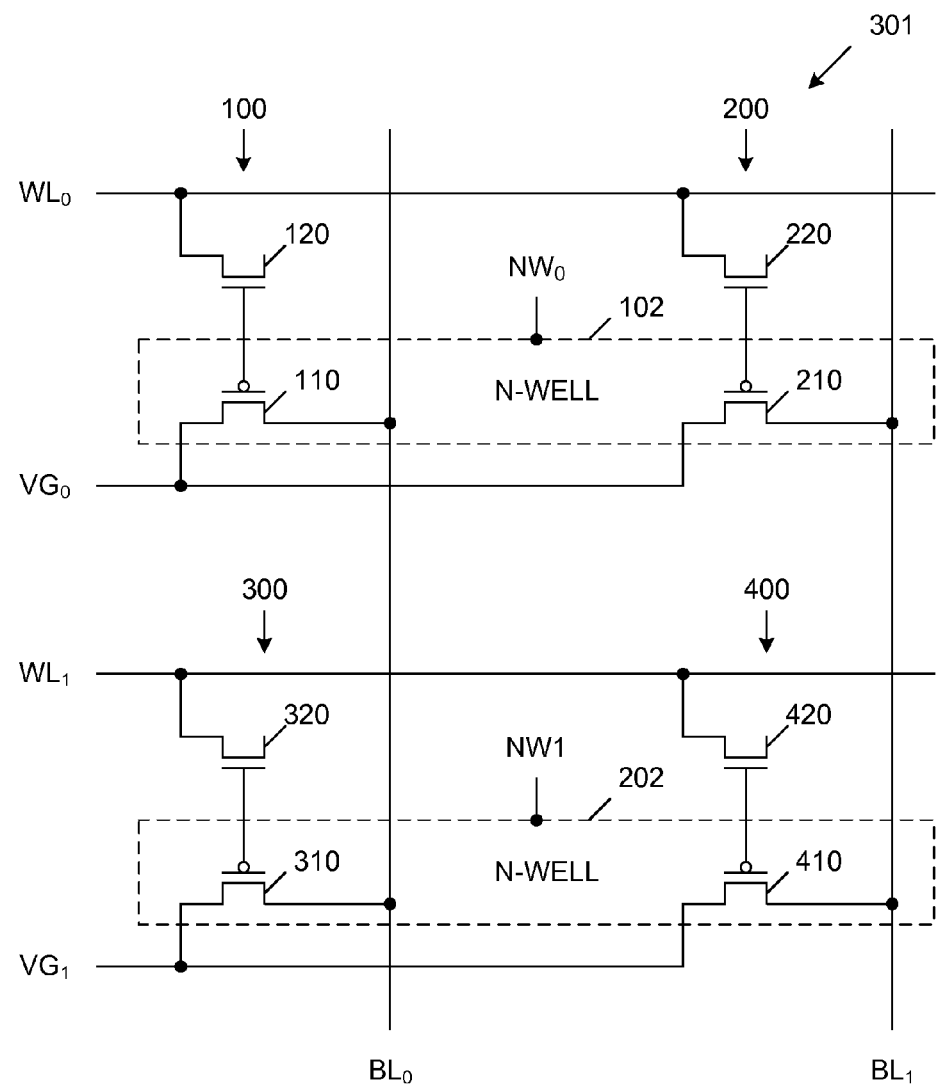
FIG. 3 is a schematic diagram of a 2×2 array of non-volatile memory cells, in accordance with one embodiment of the present invention.

FIG. 3 is a schematic diagram of a 2×2 array 301 of non-volatile memory cells 100, 200, 300 and 400, in accordance with one embodiment of the present invention. Non-volatile memory cells 200, 300 and 400 are identical to above-described non-volatile memory cell 100. Thus, non-volatile memory cells 200, 300 and 400 include PMOS access transistors 210, 310 and 410, respectively, and NMOS capacitor structures 220, 320 and 420, respectively. Non-volatile memory cells 100 and 200 are fabricated in a first n-well region $NW_0$, and non-volatile memory cells 300 and 400 are fabricated in a separate n-well region $NW_1$, which is isolated from n-well region $NW_0$. The sources of PMOS access transistors 110 and 210 are commonly connected to a first virtual ground line $VG_0$. Similarly, the sources of access transistors 310 and 410 are commonly connected to a second virtual ground line $VG_1$. The drains of PMOS access transistors 110 and 310 are commonly connected to a first bit line $BL_0$. Similarly, the drains of PMOS access transistors 210 and 410 are commonly connected to a second bit line $BL_1$. NMOS capacitor structures 120 and 220 are commonly connected to a first word line $WL_0$. Similarly, NMOS capacitor structures 320 and 420 are commonly connected to a second word line $WL_1$. Although the described array has two rows and two columns, it is understood that arrays having other sizes can be implemented by one of ordinary skill in the art. In general, each row of PMOS access transistors is fabricated in a corresponding isolated n-well region.

As shown in FIG. 3, the virtual ground lines $VG_1$-$VG_1$, n-well regions $NW_0$-$NW_1$ and word lines $WL_0$-$WL_1$ are routed in parallel along a first axis and bit lines $BL_0$-$BL_1$ are routed in parallel along a second axis, perpendicular to the first axis. Consequently, only one of the n-well regions $NW_0$-$NW_1$ and one of the bit lines $BL_0$-$BL_1$ intersect within each of non-volatile memory cells 100, 200, 300 and 400. As described below, this configuration allows a band-to-band tunneling mechanism to be used to implement a random bit program operation.

Figure 4C:
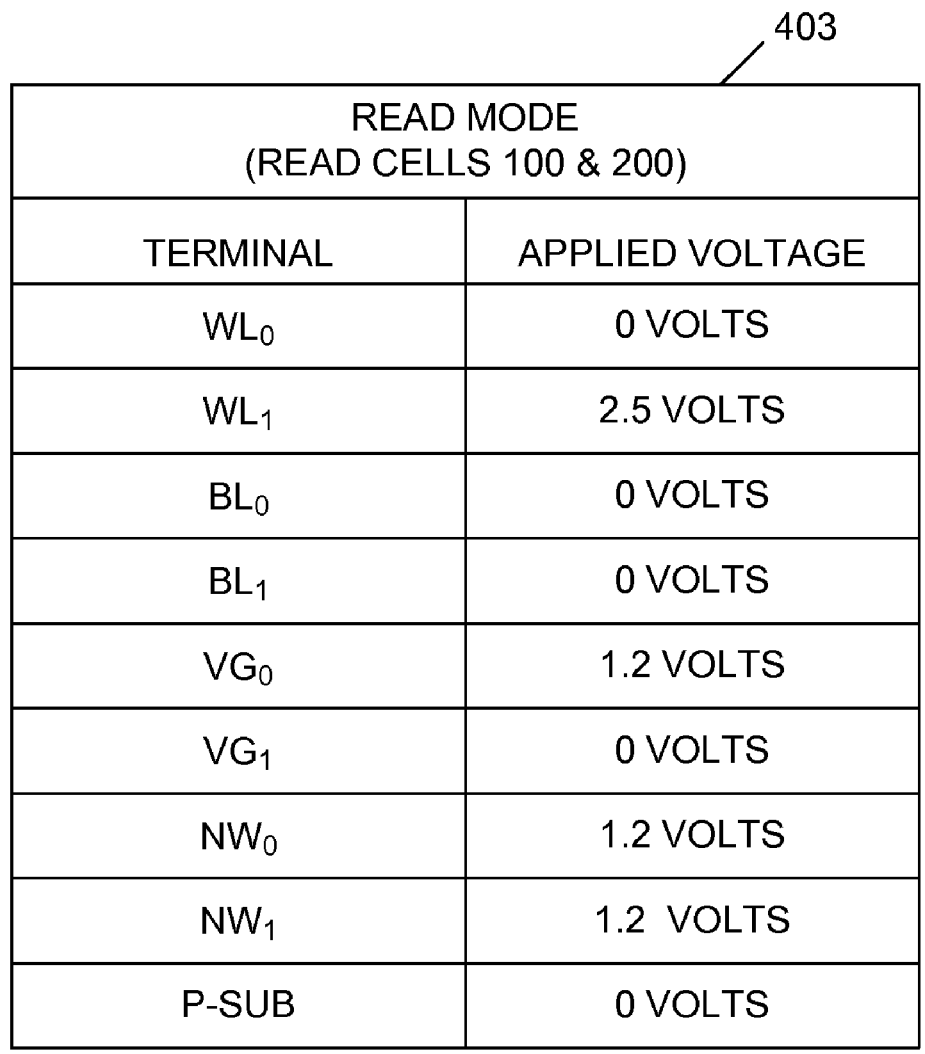

FIGS. 4A, 4B and 4C illustrate tables 401, 402 and 403, respectively, which define program, erase and read operations of the array 301 of FIG. 3 in accordance with one embodiment of the present invention. As described in more detail below, over-erase conditions are avoided in this embodiment.

The programming mode is described in connection with the programming of non-volatile memory cell 100. In the programming mode, electrons are injected into the floating gate of the cell to be programmed. As a result, the PMOS threshold voltage ($V_{tp}$) of the programmed cell is less negative (lowered) and therefore conducts more current during normal read operations. The programming mode is implemented by a band-to-band hot electron injection mechanism through the gate oxide layer 115 of PMOS access transistor 110. The programming process also includes a read operation, which is performed after electrons have been injected into the floating gate. During the write operation, a short programming pulse is applied to the memory cell 100. A read operation is then performed to effectively measure the current of PMOS access transistor 110. This technique is commonly employed in semiconductor non-volatile memories and is therefore not discussed further.

Non-volatile memory cell 100 is programmed as follows. Word line $WL_0$ is held at a voltage of 5 Volts, while bit line $BL_0$ is held at a voltage of −2.5 v and virtual ground lines $VG_0$ and $VG_1$ are each held at a voltage of 0 Volts. N-well region $NW_0$ is held at a voltage of 2.5 Volts, and p-type substrate is held at a voltage of 0 Volts. Under these bias conditions, NMOS capacitor structure 120 and PMOS access transistor 110 are placed in an accumulation mode. A relatively high voltage drop exists across the p-type drain region 112 (−2.5 Volts) of PMOS access transistor 110 and n-well region $NW_0$ (2.5 Volts) Relatively high voltage drops also exist between floating gate 115 (5 Volts) and the p-type source/drain regions 111 and 112 of PMOS access transistor 110 (0 Volts and −2.5 Volts). The resulting high electrical field conditions cause band-to-band tunneling to occur near the edges of p-type source/drain regions 111-112, wherein the resulting channel hot-electrons (CHE) are accelerated and injected into floating gate 116.

In the present example, non-volatile memory cell 200 is also selected by the 5 Volt signal applied to word line $WL_0$. However, in the described example, it is not desired to program non-volatile memory cell 200. To prevent electrons from being injected into the floating gate of non-volatile memory cell 200, bit line $BL_1$ and virtual ground line $VG_0$ are both held at a voltage of 0 Volts. Under these conditions, the voltage drop across the drain/gate overlap oxide region of PMOS access transistor 210 is substantially less (~5 Volts) than the drain/gate voltage drop of p-channel access transistor 110 (~7.5 Volts). In addition, the drain/n-well junction voltage drop of p-channel access transistor 210 (~2.5 Volts) is substantially smaller than the voltage required to induce band-to-band tunneling in this junction (e.g., ~5 Volts).

In the second row, non-volatile memory cell 300 receives the −2.5 Volt signal provided on bit line $BL_0$. However, a voltage of 0 Volts is applied to the n-well region $NW_1$ of the second row. Thus, the drain/n-well junction voltage drop is only 2.5 Volts in p-channel access transistor 310 (compared with 5 Volts in p-channel access transistor 110). Additionally, a voltage of 2.5 Volts is applied to word line $WL_1$, (compared with 5 Volts applied to word line $WL_0$). Under these lower voltage conditions, electron injection into the floating gate of non-volatile memory cell 300 is suppressed.

Finally, non-volatile memory cell 400 receives the word line voltage $WL_1$ of 2.5 Volts, the bit line voltage $BL_1$ of 0 Volts, the virtual ground line voltage $VG_1$ of 0 Volts and the n-well voltage $NW_1$ of 0 Volts. As a result, there is a 0 Volt voltage drop across the drain region and n-well region of p-channel access transistor 410, and a 2.5 Volt drop across the drain region and word line of p-channel access transistor 410. Under these conditions, electron injection into the floating gate of non-volatile memory cell 400 is suppressed.

Note that it is necessary to keep any unselected word lines (e.g., $WL_1$) at a voltage greater than 0 Volts (e.g., about 2.5 Volts), in order to suppress leakage through any already-programmed cells in the unselected rows during a program operation.

Because the program operation is performed using a band-to-band tunneling mechanism, the number of non-volatile memory cells subject to the injection of an excessive amount of electrons is advantageously minimized.

In the erase mode, electrons are removed from the floating gates of memory cells 100, 200, 300 and 400, thereby making the threshold voltage (Vtp) of PMOS access transistors 110, 210, 310 and 410 less positive (or more negative). As a result of the more negative threshold voltages, the erased PMOS access transistors are turned off during normal read operations. The sector erase operation utilizes direct and/or Fowler-Nordheim tunneling mechanisms to remove electrons from the floating gates through the gate oxide layers of the PMOS access transistors.

The erase mode is defined in more detail in table 402 of FIG. 4B. In the erase mode, word lines $WL_0$ and $WL_1$ are held at 0 Volts, and bit lines $BL_0$-$BL_1$ and virtual ground lines $VG_0$-$VG_1$ are held at 10 Volts. The n-well regions $NW_0$ and $NW_1$ are also held at 10 volts. P-type substrate 101 is held at 0 Volts. Under these bias conditions, the floating gates of memory cells 100, 200, 300 and 400 are coupled to a voltage slightly higher than 0 Volts. As a result, NMOS capacitor structures 120, 220, 320 and 420 and PMOS access transistors 110, 210, 310 and 410 are placed in an inversion mode. A relatively high voltage drop exists across the gate oxide regions of the PMOS access transistors 110, 210, 310 and 410, wherein the electric field exceeds 10 mega-Volts per centimeter (MV/cm). Under these conditions, electrons tunnel out of the respective floating gates. Because the erase operation is performed using a Fowler-Nordheim tunneling mechanism, the erase operation can be precisely controlled by controlling the erase bias voltages.

More specifically, in Fowler-Nordheim tunneling, the mechanism is controlled by the gate-to-N-well voltage only. More precisely, the tunneling mechanism depends on the net voltage across the oxide of the PMOS access transistor, which is approximately equal to the gate-to-N-well voltage minus the threshold voltage ($V_T$) of the PMOS access transistor. As more electrons removes from the floating gate, the threshold voltage $V_T$ of the PMOS access transistor increases and the net voltage across the gate oxide decreases. The decrease of the oxide voltage decreases the rate of electrons tunneling through the oxide. Thus, using a Fowler-Nordheim mechanism to remove electrons from the floating gate is a self-limiting process in this embodiment. The self-liming process minimizes the possibility of over-erase. Such self-limitation mechanism is absent in band-to-band tunneling. In addition, the band-to-band tunneling rate is controlled by two voltage potentials: the drain-to-N-well voltage and drain-to-gate voltage. Thus, the amount of electrons entering the gate is more difficult to control with a band-to-band tunneling mechanism.

The read mode is defined in more detail in table 403 of FIG. 4C. In order to read non-volatile memory cells 100 and 200 in the same row, word line $WL_0$ is held at 0 Volts, virtual ground line $VG_0$ is held at 1.2 Volts, bit lines $BL_0$ and $BL_1$ are held at 0 volts, n-well region $NW_0$ is held at 1.2 Volts, and p-type substrate 101 is held at 0 Volts. Under these conditions, read current will flow through the p-channel access transistors of programmed cells of the row, while read current will be less through the PMOS access transistors of non-programmed (erased) cells of the row.

The word line $WL_1$ associated with the non-selected row of cells is held at 2.5 Volts in the normal read mode, thereby turning off PMOS access transistors 310 and 410. Turning off PMOS access transistors 310 and 410 prevents current from flowing through these transistors into bit lines $BL_0$ and $BL_1$. As a result, non-volatile memory cells 300 and 400 do not interfere with the bit line signals from the selected non-volatile memory cells 100 and 200.

Figure 5:
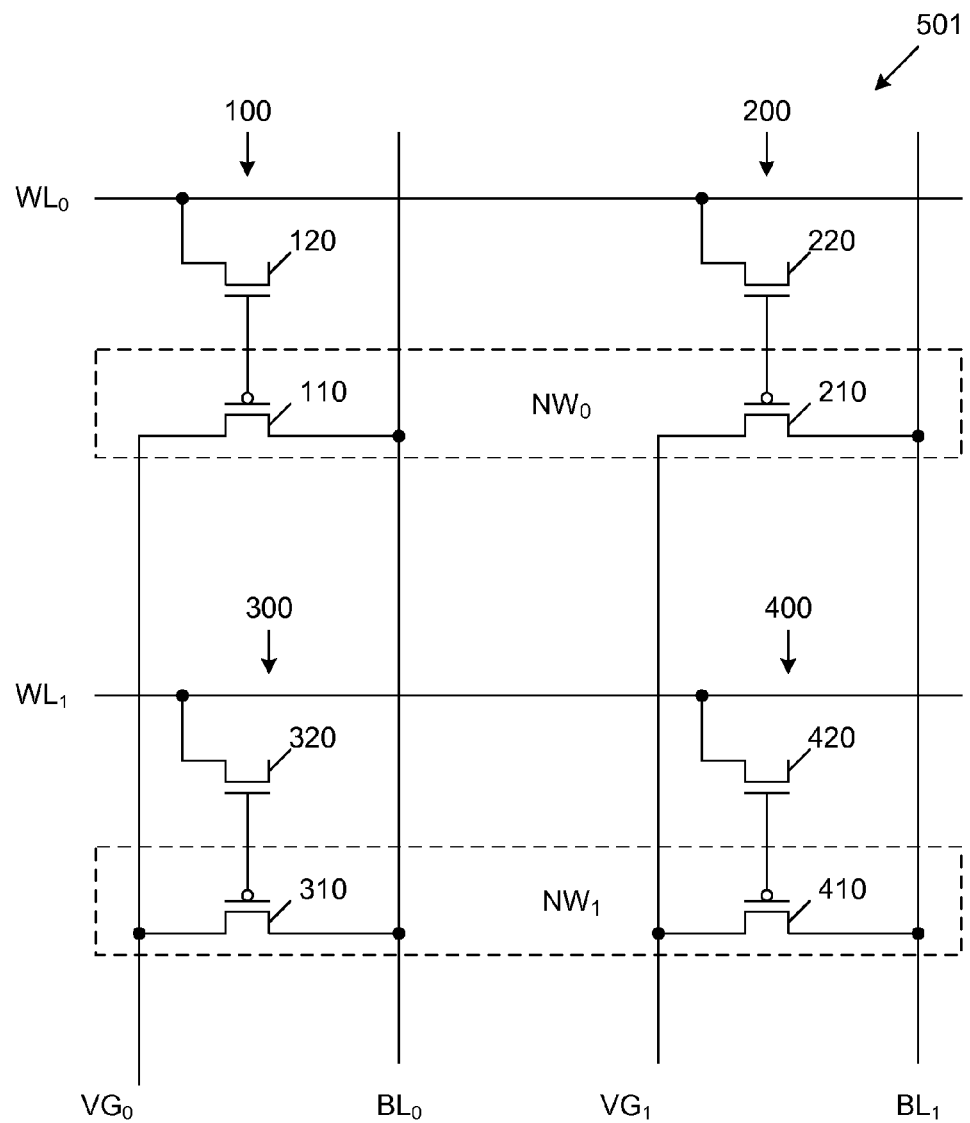
FIG. 5 is a circuit diagram of a 2×2 array of non-volatile memory cells in accordance with another embodiment of the present invention.

FIG. 5 is a circuit diagram of a 2×2 array 501 in accordance with another embodiment of the present invention. The difference between array 501 and array 301 is that the bit lines (BL) and virtual ground lines (VG) are routed in same direction in array 501, perpendicular to the direction of the n-well regions (NW) and word lines (WL). Array 501 is programmed and erased using the same bias voltages set forth in tables 401 and 402 of FIGS. 4A and 4B. Under these bias conditions, program operations implement band-to-band tunneling and erase operations implement Fowler-Nordheim tunneling in the manner described above in connection with array 301. Array 501 is read in substantially the same manner as array 301, except that all virtual ground lines $VG_0$ and $VG_1$ are held at 1.2 Volts in array 501 (such that the source regions of all of memory cells in the read row are biased at 1.2 Volts).

Figure 6:
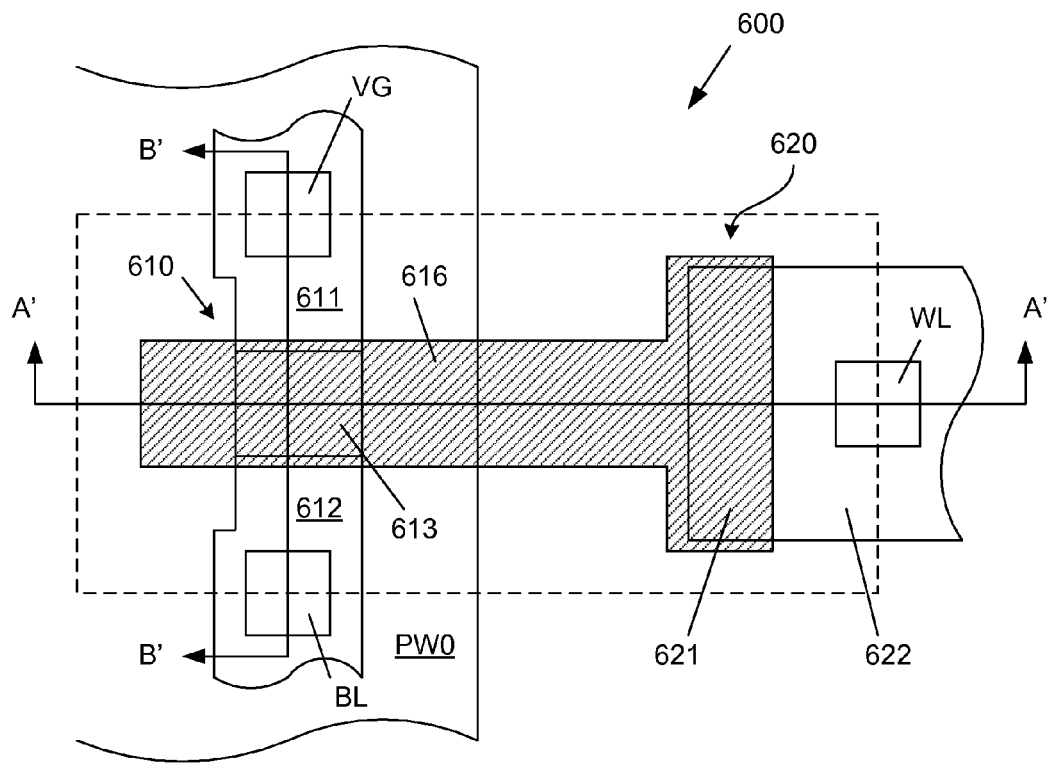
FIG. 6 is a top layout view of a non-volatile memory cell that can be fabricated using a conventional logic process, in accordance with another embodiment of the present invention.
Figure 7A:
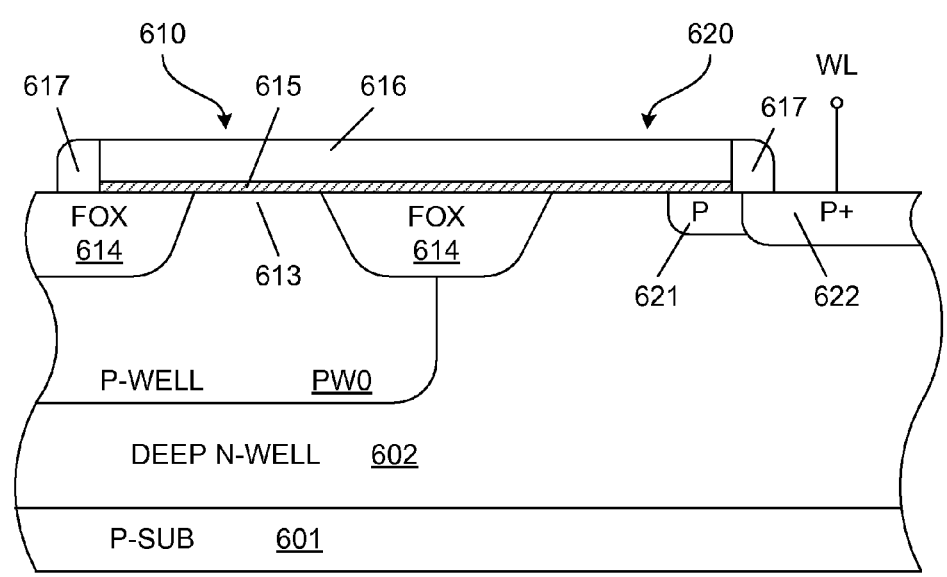
FIG. 7A is a cross-sectional view of the non-volatile memory cell of FIG. 6 along section line A'-A'.
Figure 7B:
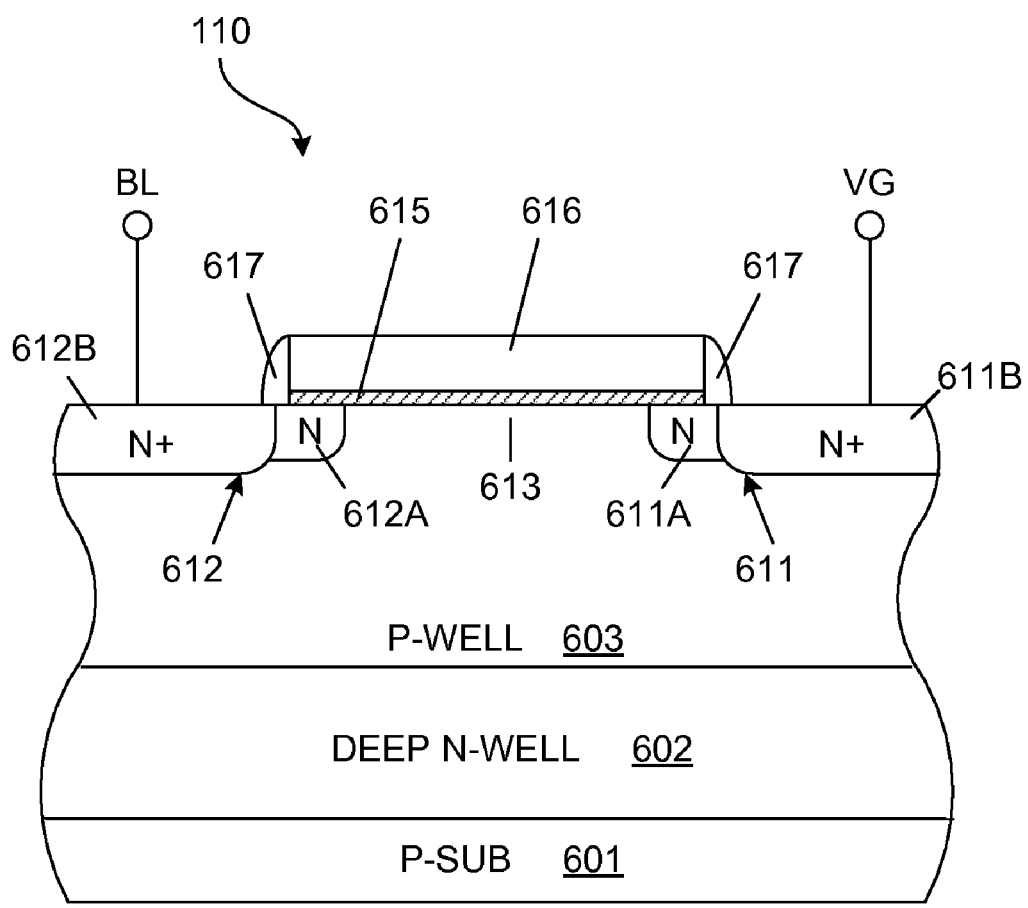
FIG. 7B is a cross-sectional view of the non-volatile memory cell of FIG. 6 along section line B'-B'.

FIG. 6 is a top layout view of a non-volatile memory cell 600 that can be fabricated using a conventional logic process, in accordance with another embodiment of the present invention. FIG. 7A is a cross-sectional view of non-volatile memory cell 600 along section line A'-A'. FIG. 7B is a cross-sectional view of non-volatile memory cell 600 along section line B'-B'.

The layout of non-volatile memory cell 600 is similar to the layout of non-volatile memory cell 100, wherein the polarities of the various semiconductor regions are reversed in non-volatile memory cell 600. Thus, non-volatile memory cell 600 is fabricated in a deep n-well (DNW) region 602 (which is located in a p-type semiconductor substrate 601). Non-volatile memory cell 600 includes an NMOS access transistor 610, having an n-type source 611 and an n-type drain 612 fabricated in a p-well region $PW_0$. Source region 611 includes lightly doped source 611A and n+ source contact region 611B. Drain region 612 includes lightly doped drain 612A and n+ drain contact region 612B. A channel region 613 is located between source and drain regions 611-612. Source region 611 is connected to a virtual-ground (VG) line and drain region 612 is connected to a bit line (BL). Planarized field oxide 614 is located around the active regions of NMOS access transistor 610. A gate oxide layer 615 is located over the channel region 613. This gate oxide layer 615 has the same thickness as the gate oxide layers used in conventional I/O transistors (not shown) fabricated in substrate 601. In the described embodiment, gate oxide layer 615 has a thickness of 70 Angstroms or thicker, thereby enabling a data retention period of 20 years. A conductively doped polycrystalline silicon floating gate 616 is located over gate oxide layer 615. Sidewall spacers 617 are located at the lateral edges of floating gate 616.

Non-volatile memory cell 600 also includes PMOS capacitor element 620, which includes p-type coupling region 621 and p+ word-line contact region 622. The total coupling capacitance of PMOS capacitor structure 620 is significantly larger than (e.g., 4×) the gate capacitance of NMOS access transistor 610. Non-volatile memory cell 600 can be fabricated using a conventional logic process having I/O devices with a gate oxide of 70 Angstroms or thicker, without any process modifications or special implants.

Figure 8:
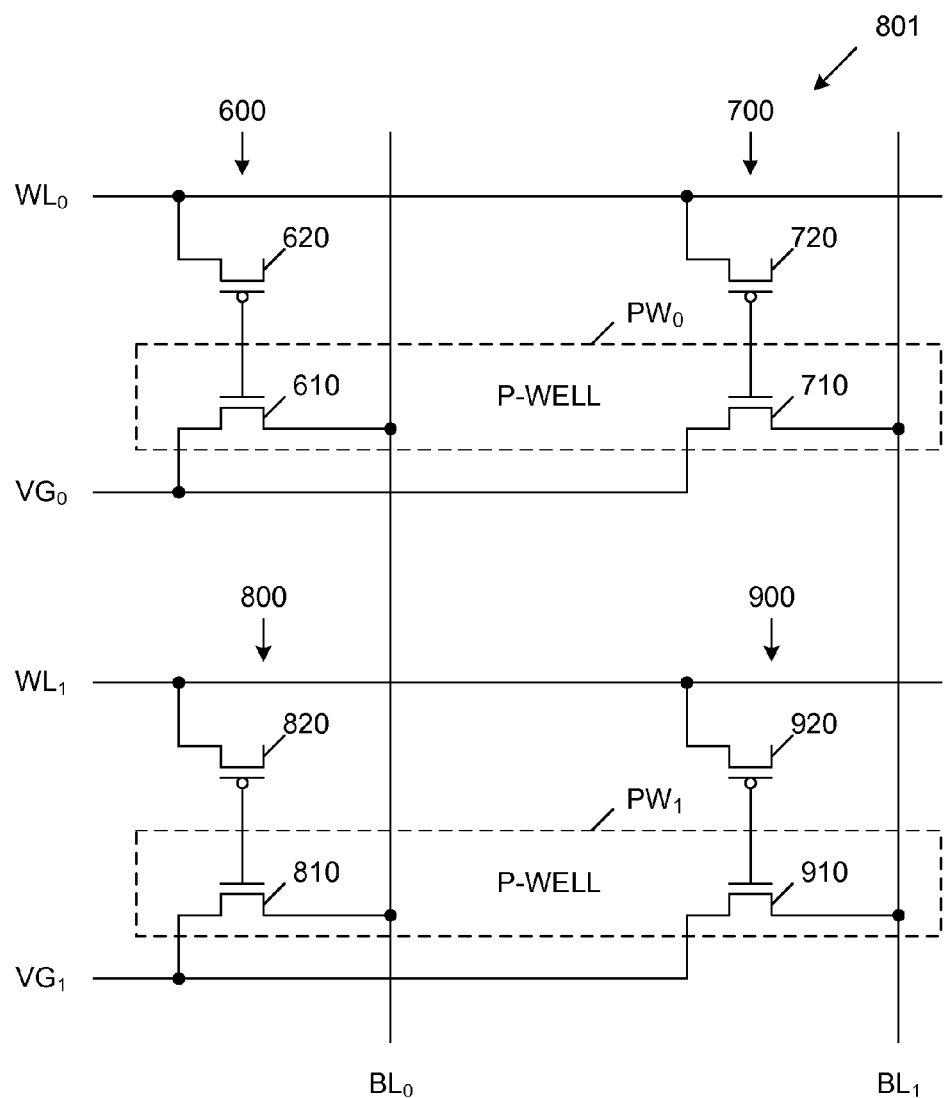
FIG. 8 is a schematic diagram of a 2×2 array of non-volatile memory cells in accordance with another embodiment of the present invention.

FIG. 8 is a schematic diagram of a 2×2 array 801 of non-volatile memory cells 600, 700, 800 and 900 in accordance with another embodiment of the present invention. Non-volatile memory cells 700, 800 and 900 are identical to above-described non-volatile memory cell 600. Thus, non-volatile memory cells 700, 800 and 900 include NMOS access transistors 710, 810 and 910, respectively, and PMOS capacitor structures 720, 820 and 920, respectively. The configuration of array 801 is similar to the configuration of array 301 (FIG. 3). Thus, NMOS access transistors 610 and 710 are fabricated in a first p-well region $PW_0$, and NMOS access transistors 810 and 910 are fabricated in a separate p-well region $PW_1$, which is isolated from p-well region $PW_0$. The sources of NMOS access transistors 610 and 710 are commonly connected to a first virtual ground line $VG_0$. Similarly, the sources of access transistors 810 and 910 are commonly connected to a second virtual ground line $VG_1$. The drains of NMOS access transistors 610 and 810 are commonly connected to a first bit line $BL_0$. Similarly, the drains of NMOS access transistors 710 and 910 are commonly connected to a second bit line $BL_1$. PMOS capacitor structures 620 and 720 are commonly connected to a first word line $WL_0$. Similarly, PMOS capacitor structures 820 and 920 are commonly connected to a second word line $WL_1$. Although the described array has two rows and two columns, it is understood that arrays having other sizes can be implemented by one of ordinary skill in the art. In general, each row of NMOS access transistors is fabricated in a corresponding isolated p-well region.

Within array 801, the virtual ground lines $VG_0$-$VG_1$, p-well regions $PW_0$-$PW_1$ and word lines $WL_0$-$WL_1$ are routed in parallel along a first axis and bit lines $BL_0$-$BL_1$ are routed in parallel along a second axis, perpendicular to the first axis. Only one of the p-well regions $PW_0$-$PW_1$ and one of the bit lines $BL_0$-$BL_1$ intersect within each of NVM cells 600, 700, 800 and 900. As described below, this configuration allows a band-to-band tunneling mechanism to be used to implement a random bit program operation.

Figure 9C:
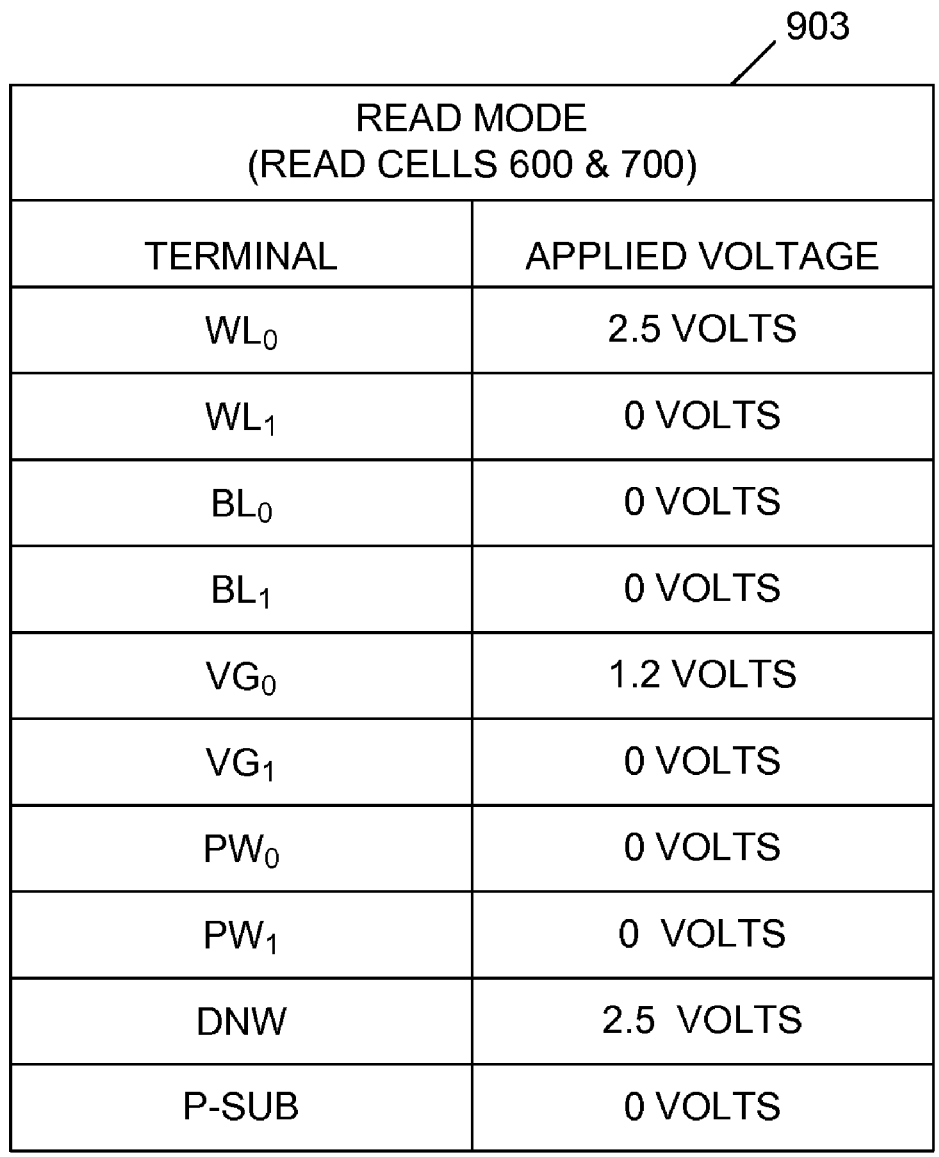

FIGS. 9A, 9B and 9C illustrate tables 901, 902 and 903, respectively, which define program, erase and read operations of the array 801 of FIG. 8 in accordance with one embodiment of the present invention. As described in more detail below, over-erase conditions are avoided in this embodiment.

The programming mode is described in connection with the programming of non-volatile memory cell 600. In the programming mode, hot holes are injected into the floating gate of the cell to be programmed. As a result, the NMOS threshold voltage ($V_{tn}$) of the programmed cell is less positive (lowered) and therefore conducts more current during normal read operations. The programming mode is implemented by a band-to-band hot hole injection mechanism through the gate oxide layer 615 of NMOS access transistor 610.

Non-volatile memory cell 600 is programmed as follows. Word line $WL_0$ is held at a voltage of −3 Volts, while bit line $BL_0$ is held at a voltage of 5 Volts and virtual ground lines $VG_0$ and $VG_1$ are each held at a voltage of 0 Volts. P-well region $PW_0$ is held at a voltage of 0 Volts, deep n-well 602 is held at a voltage of 2.5 Volts and p-type substrate is held at a voltage of 0 Volts. Under these bias conditions, PMOS capacitor structure 620 and NMOS access transistor 610 are placed in an accumulation mode. A relatively high voltage drop exists across the n-type drain region 612 (5 Volts) of NMOS access transistor 610 and p-well region $PW_0$ (0 Volts). A relatively high voltage drop also exists between floating gate 615 (−3 Volts) and the n-type drain region 612 of NMOS access transistor 610 (5 Volts). The resulting high electrical field conditions cause band-to-band tunneling to occur near the edge of n-type source/drain regions 611-612, and the resulting channel hot-holes (CHH) are accelerated and injected into floating gate 616.

In the present example, non-volatile memory cell 700 is also selected by the −3 Volt signal applied to word line $WL_0$. However, in the described example, it is not desired to program non-volatile memory cell 700. To prevent holes from being injected into the floating gate of non-volatile memory cell 700, bit line $BL_1$ and virtual ground line $VG_0$ are both held at a voltage of 0 Volts. Under these conditions, the voltage drop across the drain/gate overlap oxide region of NMOS access transistor 710 is substantially less (~3 Volts) than the drain/gate voltage drop of p-channel access transistor 610 (~8 Volts). In addition, the drain/p-well junction voltage drop of n-channel access transistor 710 (~0 Volts) is substantially smaller than the voltage required to induce band-to-band tunneling in this junction.

In the second row, non-volatile memory cell 800 receives the 5 Volt signal provided on bit line $BL_0$. However, a voltage of 2.5 Volts is applied to the p-well region $PW_1$ of the second row. Thus, the drain/p-well junction voltage drop is only 2.5 Volts in NMOS access transistor 810 (compared with 5 Volts in NMOS access transistor 610). Additionally, a voltage of 0 Volts is applied to word line $WL_1$, such that the voltage drop across the drain/gate overlap oxide region of NMOS access transistor 810 is substantially less (~5 Volts) than the drain/gate voltage drop of p-channel access transistor 610 (~8 Volts). Under these lower voltage conditions, hole injection into the floating gate of non-volatile memory cell 800 is suppressed.

Finally, non-volatile memory cell 900 receives the word line voltage $WL_1$ and the bit line voltage $BL_1$, each equal to 0 Volts, and the p-well voltage $PW_1$ of 2.5 Volts. As a result, there is a 2.5 Volt voltage drop across the drain region and p-well region of NMOS access transistor 910. Under these conditions, hole injection into the floating gate of non-volatile memory cell 900 is suppressed.

In the erase mode, electrons are injected into the floating gates of memory cells 600, 700, 800 and 900, thereby making the threshold voltage (Vtn) of NMOS access transistors 610, 710, 810 and 910 more positive (increased). As a result of the more positive threshold voltages, the erased NMOS access transistors are turned off during normal read operations. The erase operation utilizes a Fowler-Nordheim tunneling mechanism to tunnel electrons from the channels of NMOS access transistors 610, 710, 810 and 910 into the corresponding floating gates through the associated gate oxide layers of these NMOS access transistors.

The erase mode is defined in more detail in table 902 of FIG. 9B. In the erase mode, word lines $WL_0$ and $WL_1$ are held at 5 Volts, and bit lines $BL_0$-$BL_1$, virtual ground lines $VG_0$-$VG_1$ and p-well regions $PW_0$-$PW_1$ are held at −5 Volts. Deep n-well 602 is held at 5 Volts and p-type substrate 601 is held at 0 Volts. Under these bias conditions, the floating gates of memory cells 600, 700, 800 and 900 are coupled to a voltage slightly less than 5 Volts. As a result, PMOS capacitor structures 620, 720, 820 and 920 and NMOS access transistors 610, 710, 810 and 910 are placed in an inversion mode. A relatively high voltage drop exists across the gate oxide regions of NMOS access transistors 610, 710, 810 and 910, wherein the electric field exceeds 10 megaVolts per centimeter (MV/cm). Under these conditions, electrons in the inversion channel or source/drain regions of NMOS access transistors 610, 710, 810, and 910 tunnel into the respective floating gates.

The read mode is defined in more detail in table 903 of FIG. 9C. In order to read non-volatile memory cells 600 and 700 in the same row, word line $WL_0$ is held at 2.5 Volts, virtual ground line $VG_0$ is held at 1.2 Volts, bit lines $BL_0$ and $BL_1$ are held at 0 volts, p-well region $PW_0$ is held at 0 Volts, deep n-well region 602 is held at 2.5 Volts, and p-type substrate 101 is held at 0 Volts. Under these conditions, read current will flow through the NMOS access transistors of programmed cells of the row, while read current will be less through the NMOS access transistors of non-programmed (erased) cells of the row.

The word line $WL_1$ associated with the non-selected row of cells is held at 0 Volts in the normal read mode, thereby turning off NMOS access transistors 810 and 910. Turning off NMOS access transistors 810 and 910 prevents current from flowing through these transistors into bit lines $BL_0$ and $BL_1$. As a result, non-volatile memory cells 800 and 900 do not interfere with the bit line signals from the selected non-volatile memory cells 600 and 700.

Figure 10:
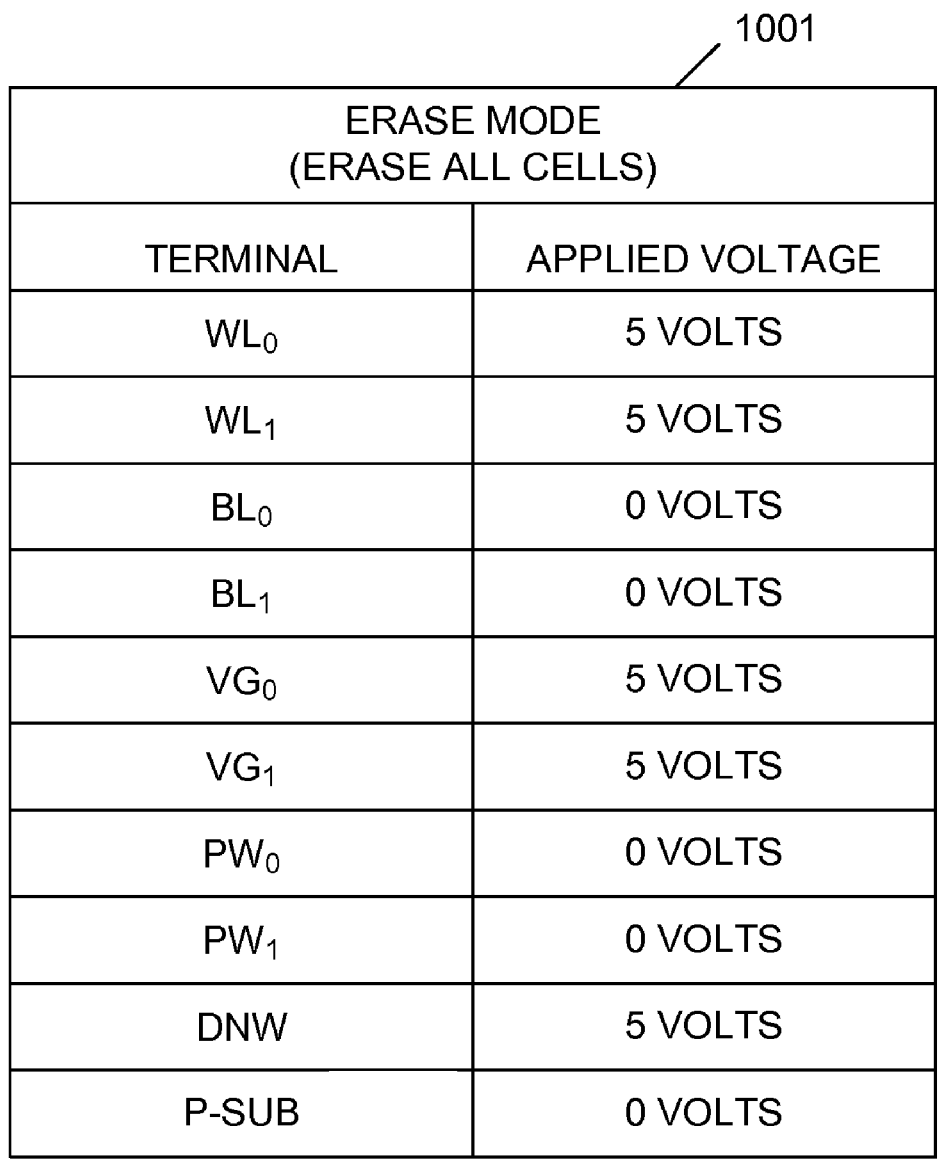
FIG. 10 is a table that defines the bias voltages used to erase the non-volatile memory cells of the array of FIG. 8 in accordance with an alternate embodiment of the present invention.

FIG. 10 is a table 1001 which defines the bias voltages used to erase the non-volatile memory cells of array 801 in accordance with an alternate embodiment of the present invention. In this alternate erase mode, word lines $WL_0$ and $WL_1$, virtual ground lines $VG_0$ and $VG_1$, and deep n-well 602 are held at 5 Volts. Bit lines $BL_0$-$BL_1$, p-well regions $PW_0$-$PW_1$ and p-type substrate 101 are held at 0 Volts. Under these bias conditions, transistors 610, 710, 810 and 910 are biased in the saturation region, whereby a strong lateral electrical field exists between the channel and the drain region within each of the NMOS access transistors 610, 710, 810 and 910. In the charge depletion zone near the drain region, channel-electrons are accelerated by the high lateral field. Some of the electrons may acquire a sufficient velocity so as to cause impact ionization. During impact ionization, some of the hot electrons are scattered when colliding with the semiconductor lattice. Some of the scattered hot electrons may be attracted by the vertical field and tunnel through the gate oxide and eventually trapped in the floating gate. Hot electron and impact ionization mechanism are well known in the field of device physics. The trapped electrons in the floating gates increase the threshold voltages of the NMOS access transistors 610, 710, 810 and 910. Consequently, the non-volatile memory cells 600, 700, 800 and 900 are erased by channel hot electron injection caused by impact ionization.

Although the present invention has been described in connection with several embodiments, it is understood that this invention is not limited to the embodiments disclosed, but is capable of various modifications and embodiments which would be apparent to one of ordinary skill in the art. It is, therefore, contemplated that the appended claims will cover any such modifications or embodiments as falling within the true scope of the invention.

We claim:

1. A non-volatile memory system comprising:
   an array of non-volatile memory cells arranged in a plurality of rows and columns, wherein each of the non-volatile memory cells includes an access transistor having source/drain regions of a first conductivity type and a capacitor structure having a diffusion region of a second conductivity type, opposite the first conductivity type, wherein the access transistor and capacitor structure share a common floating gate, and wherein each of the rows includes a corresponding isolated well region of the second conductivity type, wherein the access transistors in each row are fabricated in the isolated well region corresponding with the row;

a first set of control lines, wherein each of the control lines in the first set is coupled to the source of each access transistor in a corresponding row; and a second set of control lines, wherein each of the control lines in the second set is coupled to the drain of each access transistor in a corresponding column.

2. The non-volatile memory system of claim 1, further comprising a well bias control circuit configured to independently bias the isolated well regions.

3. The non-volatile memory system of claim 1, wherein the first set of control lines extend in parallel with the well regions along a first axis.

4. The non-volatile memory system of claim 3, wherein the second set of control lines extend in parallel along a second axis, perpendicular to the first axis.

5. The non-volatile memory system of claim 1, further comprising a third set of control lines, wherein each of the control lines in the third set is coupled to the diffusion region of each capacitor structure in a corresponding row.

6. The non-volatile memory system of claim 1, further comprising programming means for inducing band-to-band tunneling in selected access transistors in a selected row of the array, thereby programming the non-volatile memory cells that include the selected access transistors.

7. The non-volatile memory system of claim 6, wherein the programming means further comprises means for preventing band-to-band tunneling in non-selected access transistors in the selected row of the array by controlling a bias voltage applied to the drains of these non-selected access transistors.

8. The non-volatile memory system of claim 6, wherein the programming means further comprises means for preventing band-to-band tunneling in access transistors in non-selected rows of the array by controlling bias voltages applied to the well regions associated with these non-selected rows.

9. The non-volatile memory system of claim 6, wherein the programming means is configured to induce the band-to-band tunneling by controlling the junction voltage between the drain and well region of the selected access transistors.

10. The non-volatile memory system of claim 9, wherein the junction voltage is about 5 Volts.

11. The non-volatile memory system of claim 1, further comprising erase means for inducing Fowler-Nordheim tunneling in all of the access transistors in the array, thereby simultaneously erasing all of the non-volatile memory cells in the array.

* * * * *